United States Patent
Lim et al.

(10) Patent No.: US 7,696,840 B2
(45) Date of Patent: Apr. 13, 2010

(54) RF SELECTION SWITCH FOR MULTIPLE ANTENNA INPUT

(75) Inventors: Kui Y. Lim, Singapore (SG); Siew K. Ong, Singapore (SG)

(73) Assignee: NXP B.V., Eindhoven (NL)

( * ) Notice: Subject to any disclaimer, the term of this patent is extended or adjusted under 35 U.S.C. 154(b) by 166 days.

(21) Appl. No.: 11/574,234

(22) PCT Filed: Aug. 22, 2005

(86) PCT No.: PCT/IB2005/052751

§ 371 (c)(1),
(2), (4) Date: Dec. 7, 2007

(87) PCT Pub. No.: WO2006/021923

PCT Pub. Date: Mar. 2, 2006

(65) Prior Publication Data

US 2008/0191813 A1      Aug. 14, 2008

(30) Foreign Application Priority Data

Aug. 25, 2004   (EP) .................................. 04300555

(51) Int. Cl.
*H01P 1/15*   (2006.01)
*H01L 27/24*   (2006.01)

(52) U.S. Cl. ..................... 333/103; 333/262
(58) Field of Classification Search ................. 333/101, 333/103, 104, 262
See application file for complete search history.

(56) References Cited

U.S. PATENT DOCUMENTS

| 3,047,741 | A |   | 7/1962  | Snow |
|-----------|---|---|---------|------|
| 3,702,898 | A |   | 11/1972 | Webb |
| 4,227,094 | A | * | 10/1980 | Semur et al. ............. 307/113 |
| 4,400,735 | A |   | 8/1983  | Strammello, Jr. |
| 4,742,249 | A | * | 5/1988  | Alpaiwalla et al. ........ 327/484 |
| 4,843,354 | A | * | 6/1989  | Fuller et al. ............ 333/81 A |
| 5,327,017 | A | * | 7/1994  | Fischer et al. ............ 327/407 |
| 6,094,088 | A |   | 7/2000  | Yano |
| 6,650,199 | B2 | * | 11/2003 | Dobrovolny ............... 333/103 |
| 7,307,490 | B2 | * | 12/2007 | Kizuki et al. ............. 333/101 |

FOREIGN PATENT DOCUMENTS

EP   0 438 228 A2   7/1991
GB   1 579 075      11/1980

OTHER PUBLICATIONS

International Preliminary Report on Patentability for International patent appln. PCT/IB2005/052751 (Feb. 2007).

* cited by examiner

*Primary Examiner*—Dean O Takaoka

(57) ABSTRACT

RF switches are known from the art for selecting an RF signal from a multiple of inputs. For instance a TV-tuner and TV-Front-end can have two or more antenna inputs but are implemented with a relative bad cost performance. The present invention relates to an RF selection switch circuit (200). The switch comprises a first switch (202), a second switch (204) with both an RF input port and a common RF output port a control signal circuitry (206). In a preferred embodiment the switches comprise pin-diodes. The RF output port comprises two transistors (T1, T2), one of which at a time can put the non-selected switch to a low-impedance level in order to minimize signal leakage the common output port.

12 Claims, 7 Drawing Sheets

US 7,696,840 B2

RF SELECTION SWITCH FOR MULTIPLE ANTENNA INPUT

FIELD OF THE INVENTION

The invention relates to an RF (Radio Frequency) input circuit provided with an RF switch with multiple inputs and at least one output, having a good isolation between the inputs, a good sensitivity and provided at low cost.

The present invention is particularly relevant for a TV-tuner and TV-Front-end that have two or more antenna inputs such as one for cable TV and one for terrestrial TV.

BACKGROUND OF THE INVENTION

RF switches are known from the art for selecting an RF signal from a multiple of inputs. For instance a TV-tuner and TV-Front-end that have two or more antenna inputs such as one for cable TV and one for terrestrial TV or one with provided with two cable TV inputs (A/B).

Two main solutions are known today for an RF switch, an electro-mechanical switch and an electronical switch. The electromechanical switch is bulky, relatively expensive (BOM), high voltage and current compared to electronics means. In the electronics solution, if good isolation is required (e.g., FCC requirement) more than one RF switch in cascade may be required in order to meet an isolation requirement.

In both the cases of RF switch, a control circuit is needed. FIG. 1 shows an example of a prior art electronical switch with a 2× diode RF switch cascaded with a MOSFET SPDT (Single Pole Double Throw) switch. An IC can implement a switching control circuit.

Examples of RF switches can be found in U.S. Pat. No. 4,400,735 (named "Multi-component video system controller", described by Stramello), U.S. Pat. No. 3,047,741 (named "Multiple channel electronic switching circuit" and described by Snow), U.S. Pat. No. 4,742,249 (named "RF switch with diode network and control latch sharing common element" and described by Alpaiwalla) and U.S. Pat. No. 6,650,199 (named "RF A/B switch with substantial isolation" described by Dobrovolny).

In an application where the RF module is connected to the two antenna inputs, for example cable and terrestrial inputs, certain isolation is needed to ensure that there is no undesired signal leaking through or cross interference between two inputs signal either when the device is power on or off. Beside the fitness for use, it is a regulatory requirement such as an FCC recommendation. The FCC require an isolation between two inputs as follows:

| 54 MHz to 216 MHz | 80 dBmin |
| 216 MHz to 550 MHz | 60 dBmin |
| 550 MHz to 806 MHz | 55 dBmin |

To meet the above requirement, relatively expensive and complicated RF switches have been deployed in the prior art. Beside the isolation requirement, a good RF switch should have as minimum insertion loss as possible to ensure the good sensitivity still visible.

The inventor proposes an alternative for the relative expensive and complicated switch, such as an existing RF switch solution used in the Philips' TUV1236D, namely the TUV1236D RF switch.

SUMMARY OF THE INVENTION

It is, accordingly, an object of the present invention to provide an RF switch with sufficient to superior isolation between the inputs and with little insertion loss.

It is another object of the invention to teach and practice a low cost RF switch that requires little printed circuit board space.

It is yet another object of the invention to provide a tuner or tuning system comprising an RF switch with sufficient to superior isolation between the inputs and with little insertion loss.

It is yet another object of the invention to provide an apparatus for receiving RF signals from a multiple of sources comprising an RF switch with sufficient to superior isolation between the inputs and with little insertion loss.

In one embodiment, dual diode switches have been applied for switching between two signal inputs. The switch in off state, and thereby the non-selected input signal, is made low-impedance. This is achieved using a transistor that has an output switched to low-impedance and connected to the switch in off state, in order to provide a minimum non-selected input signal leakage to the output of the switch. In a related embodiment pin-diode switches have been applied to provide a superior isolation between the inputs.

These and other aspects of the invention will be apparent from and will be elucidated with reference to the embodiments described hereinafter.

BRIEF DESCRIPTION OF THE DRAWINGS

The present invention will now be described in more detail, by way of example, with reference to the accompanying drawings, wherein.

Throughout the drawings, the same reference numeral refers to the same element, or an element that performs substantially the same function.

DETAILED DESCRIPTION OF THE INVENTION

Figure 1:
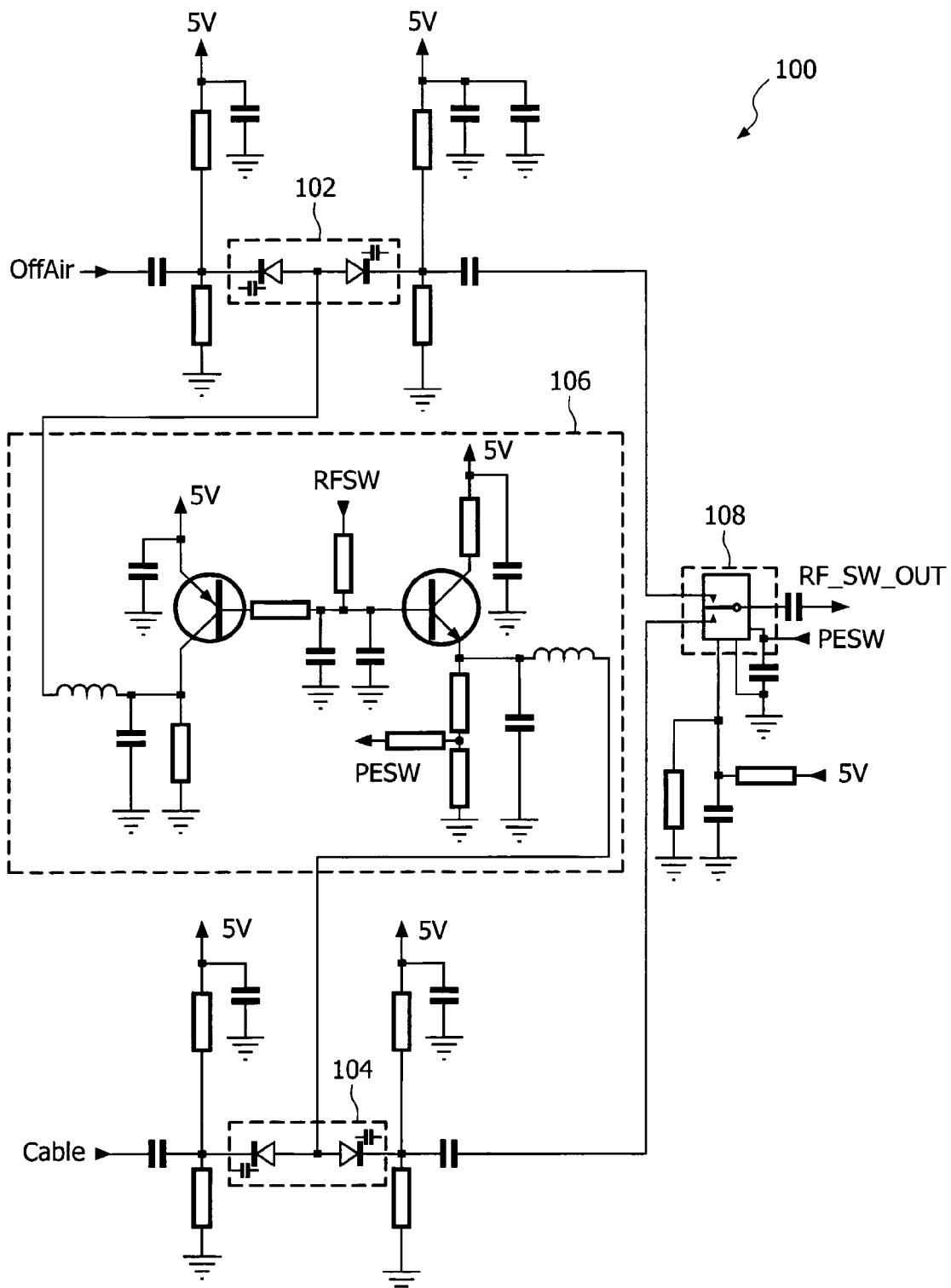
FIG. 1 shows a circuit diagram of a prior art RF switch circuit.

FIG. 1 shows a circuit diagram of a prior art RF switch circuit.

FIG. 1 shows a TUV1236D RF switch circuit 100 comprising 2× diode 102 and 104, switching control circuit 106 and Peregrine MOSFET Switch 108. RF input signals are Off-Air and Cable and the RF output signal is RF_SW_Out.

In general, signal isolation is realized by cascading a 2× diode and a Peregrine MOSFET Switch. Peregrine MOSFET switch 108 is a single pole double throw (SPDT) switch or 2 input ports with one output port. Depending on the status of control signal RFSW, the output port/pin is connected at the either one of the input ports/pins at one time. An MSOP-8-pins IC can realize the Peregrine MOSFET switch 108.

From FIG. 1, the operation switch is relative simple. When a user wants to receive an off-air signal Off-Air, the corresponding 2× diode 102 at the off-air signal path will be switched-on and the Peregrine MOSFET switch 108 will be switched to the desired input port/pin (in FIG. 1 to the upper input position) to allow the Off-Air signal path to appear at the output (RF_SW_out) with minimum insertion loss. At the same time Cable signal path should be maximum attenuated/isolated when the user is in the off-air signal-receiving mode. In this case the 2× diodes 104 at the cable signal path will be in the off-state and the Peregrine MOSFET switch will have the cable input port/pin (in FIG. 1 the lower input position) disconnected. A MOPLL IC or circuitry can supply the control signal, RFSW.

Vice versa, when a user wants to receive the cable antenna input Cable, 2× diode 102 will be switched off, 2× diode 104 will be switched on, and Peregrine MOSFET Switch 108 will be passing the lower input signal from the Cable signal path while the Off-Air signal path will be given a maximum attenuation.

Figure 2:
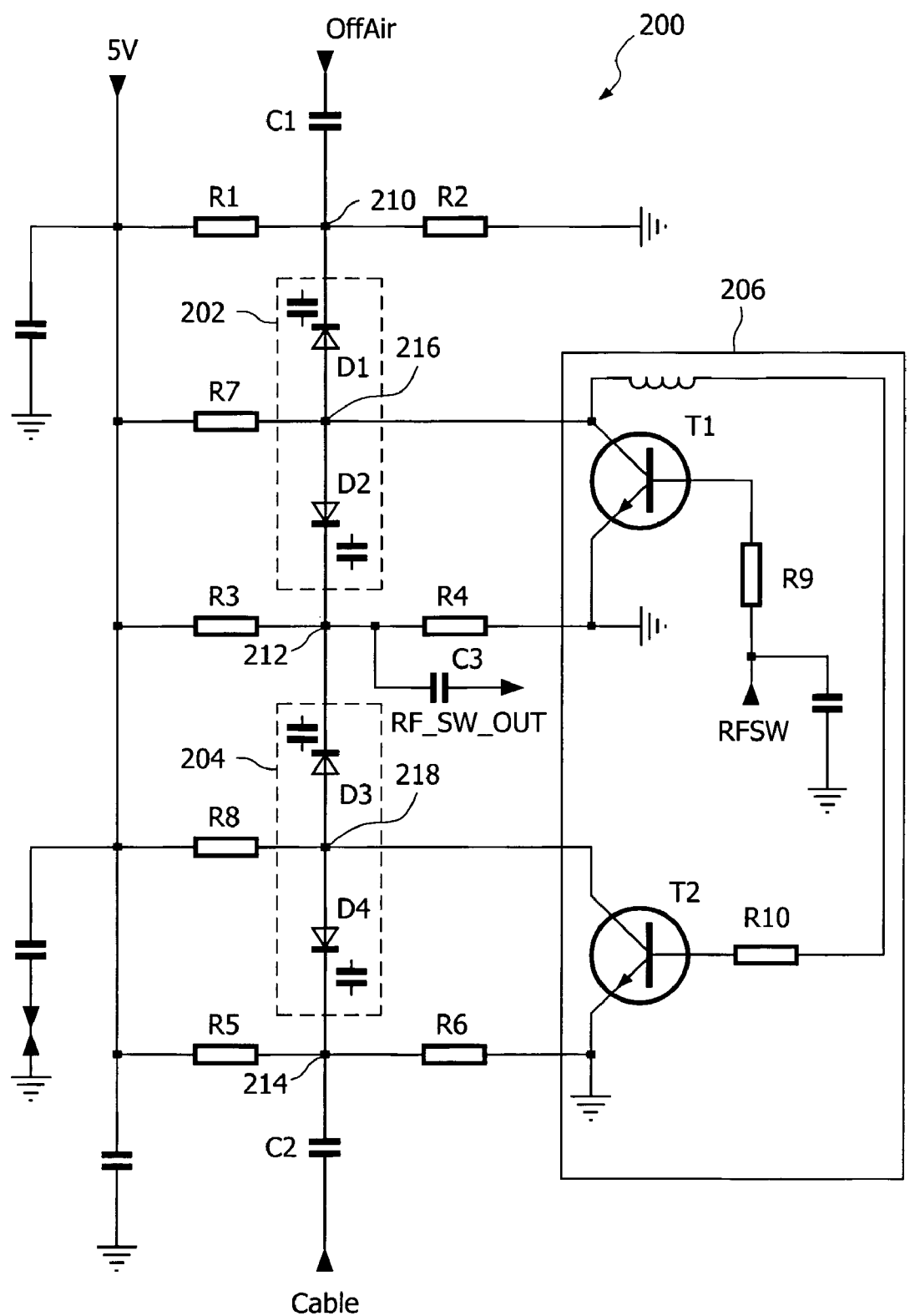
FIG. 2 shows a circuit diagram of an RF switch circuit in accordance with the invention.

FIG. 2 shows circuit diagram of an RF switch circuit 200 in accordance with the invention. RF switch circuit 200 comprises 2× diode 202 (comprising diodes D1 and D2), 2× diode 204 (comprising diodes D3 and D4) and control signal circuitry 206. FIG. 2 shows RF input signal ports Off-Air and Cable and output signal port RF_SW_OUT. Control signal circuitry 206 performs part of an insulation function between the non-selected input and the output RF_SW_OUT. The proposed circuitry in accordance of the invention exhibits an insulation and insertion loss performance that is similar or even better compared to cascading two prior art RF switches.

When in operation, point 210 (cathode of D1) is set at a DC level of about half the supply voltage (in FIG. 2 around 2.5 V) using resistors R1 and R2. Points 212 (cathodes of D2 and D3) and 214 (cathode of D4) are set at a DC level of about half the supply voltage in a similar way.

In one state of operation, when control input port RFSW is set to high state (typically supply voltage level) transistor T1 starts conducting and will bring its collector output to a low state (close to ground) and thus point 216 (anodes of D1 and D2) becomes low. That means that the diodes in 2× diode 202 become non-conductive and will effectively block a signal coming from port Off-Air to pass 2× diode 202 to point 212. Moreover point 216 becomes a low impedance point through transistor T1 that is in a conductive state. The low impedance will provide a better insulation from signal port Off-Air to output port RF_SW_OUT. As the collector of transistor T1 is low, also the basis of transistor T2 becomes low and transistor T2 will be in a non-conductive state. As a consequence, the collector of transistor T2 will float and will become in a high state through resistor R8. As a consequence, the diodes in 2× diode 204 will get in a conductive state and will pass through an RF signal coming from signal port Cable to point 212. The signal coming from signal port Cable will be passed to signal output port RF_SW_OUT. Capacitors C1, C2, and C3 block any DC to pass but will be big enough to pass an RF-signal.

In another state of operation, when RFSW is set to low state (typically ground level) transistor T1 becomes non-conducting and will bring its collector output to a floating state and thus point 216 becomes high through resistor R7. That means that the diodes in 2× diode 202 become conductive and will effectively pass a signal coming from port Off-Air to pass 2× diode 202 to point 212. As the collector of transistor T1 is high, also the basis of transistor T2 becomes high and transistor T2 will get in a conductive state. As a consequence, the collector of transistor T2 will get in a low state. As a consequence, the diodes in 2× diode 204 will get in a non-conductive state and will not pass through an RF signal coming from signal port Cable to point 212. Moreover point 218 (anodes of D3 and D4) becomes a low impedance point through transistor T2 that is now in a conductive state. The low impedance will provide a better insulation from signal port Cable to output port RF_SW_OUT. Capacitors C1, C2, and C3 block any DC to pass but will be big enough to pass an RF-signal.

The control signal circuitry 206 is arranged to select one of the 2× diode switch 202 and the 2× diode switch 204 for passing respective selected RF-input signal to the RF signal output port. The control signal circuitry 206 is also arranged to establish a low-impedance mode on a non-selected of one of the 2× diode switch 202 and the 2× diode switch 204 as to minimize cross-talk from a non-selected RF-input signal to the RF signal output port.

Summarized, a high on control input port RFSW will enable a signal from input port Cable to pass to output port RF_SW_OUT and a low on control input port RFSW will enable a signal from input port Off-Air to pass to output port RF_SW_OUT. The switching is executed with a minimum insertion loss from input to output and a high insulation between the two input ports.

RF switch circuit 200 is clearly simpler compared to the prior art RF switch circuit 100 as, e.g., the SPDT MOSFETs Switch 108 and its related components have been removed and the Control signal circuitry 106 has been simplified. This results in a significant lower Bill Of Materials (BOM), higher reliability, and also in a PCB area saving that enables in turn a more compact design, relevant for miniaturization.

The inventor found that when applying pin-diodes for in 2× diode switch 202 and 2× diode switch 204, the switches provide, e.g., superior isolation behavior, e.g., between inputs. The inventor however envisions that other types of diodes with superior switching behavior will emerge as technology improvement proceeds and can be applied in the spirit of the invention.

Figure 3:
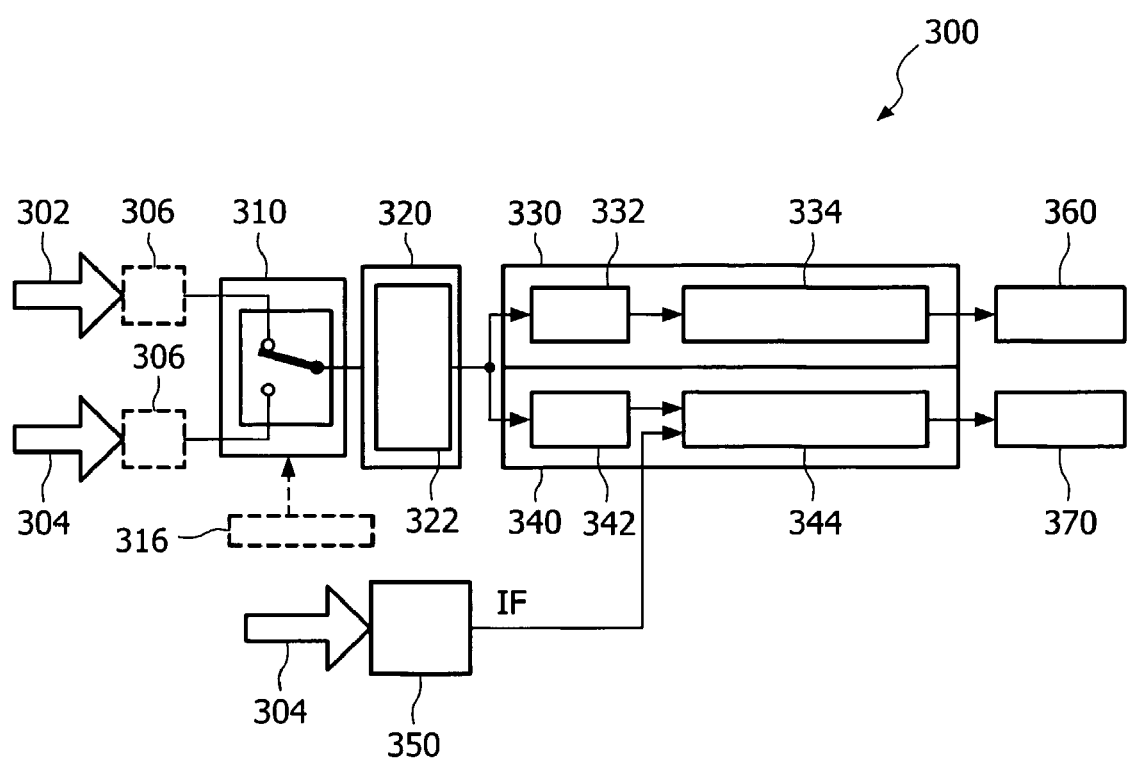
FIG. 3 shows a tuning system comprising an RF switch circuit in accordance with the invention.

FIG. 3 shows a tuning system 300 comprising an RF switch circuit 310 in accordance with the invention. Furthermore, tuning system 300 comprises a terrestrial input port 302, a cable input port 304, LNA 306, Tuner part 320 that comprises a hybrid tuner 322, analog part 330 that comprises analog IF 332 and analog IF demodulation 334, digital part 340 that comprises digital IF 342 and digital IF demodulation (Channel decoder) 344, OOB tuner 350, output port CVBS/SIF 360 and output port TS/POD 370. RF-switch 310 comprises RF switch circuit 200 of FIG. 2.

Tuning system 300 can be used in an apparatus for receiving RF signals from a multiple of sources. Such sources can include a cable-TV source, an off-air TV source, an in house TV signal distribution source, an RF data source, an RF audio source, etc. Examples of such apparatus include a television receiver, a multi-media receiver, a personal computer, etc.

Figure 4A:
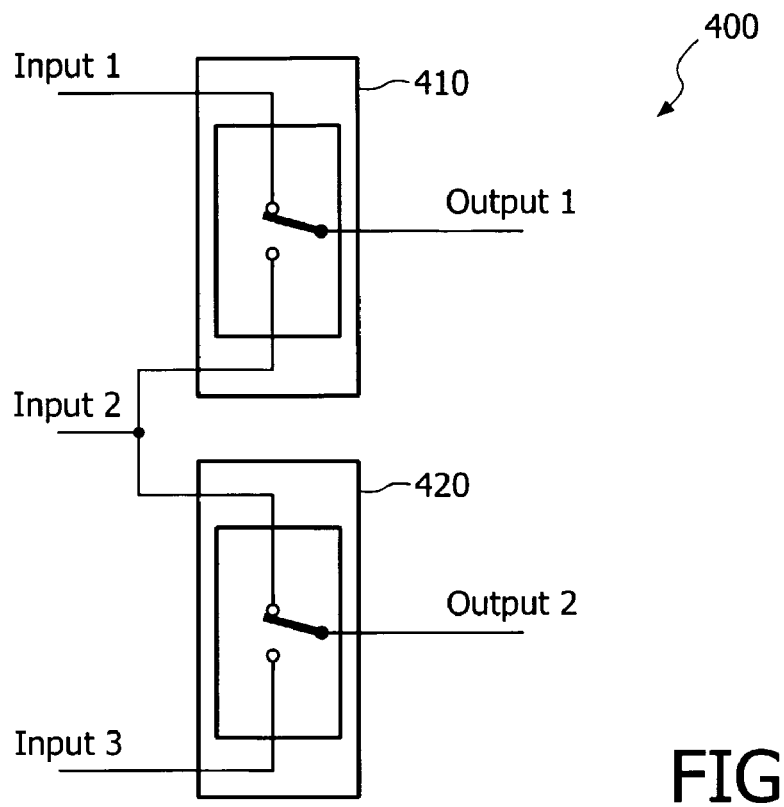
FIGS. 4a and 4b show examples of extended switches in accordance with the invention comprising a multiple of the RF switch circuits.
Figure 4B:
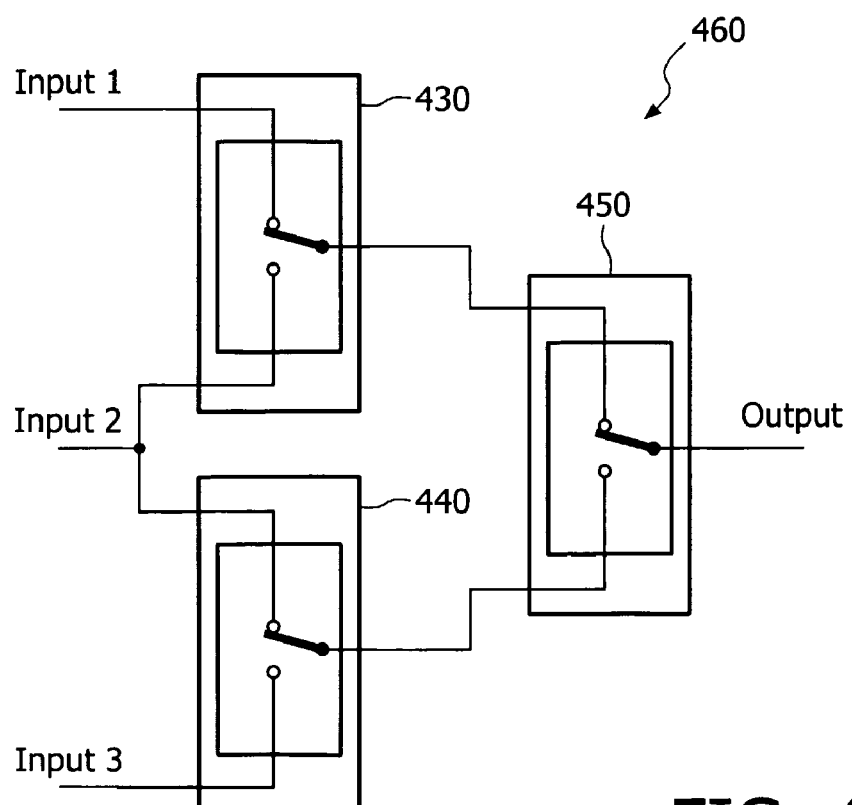
Figure 5:
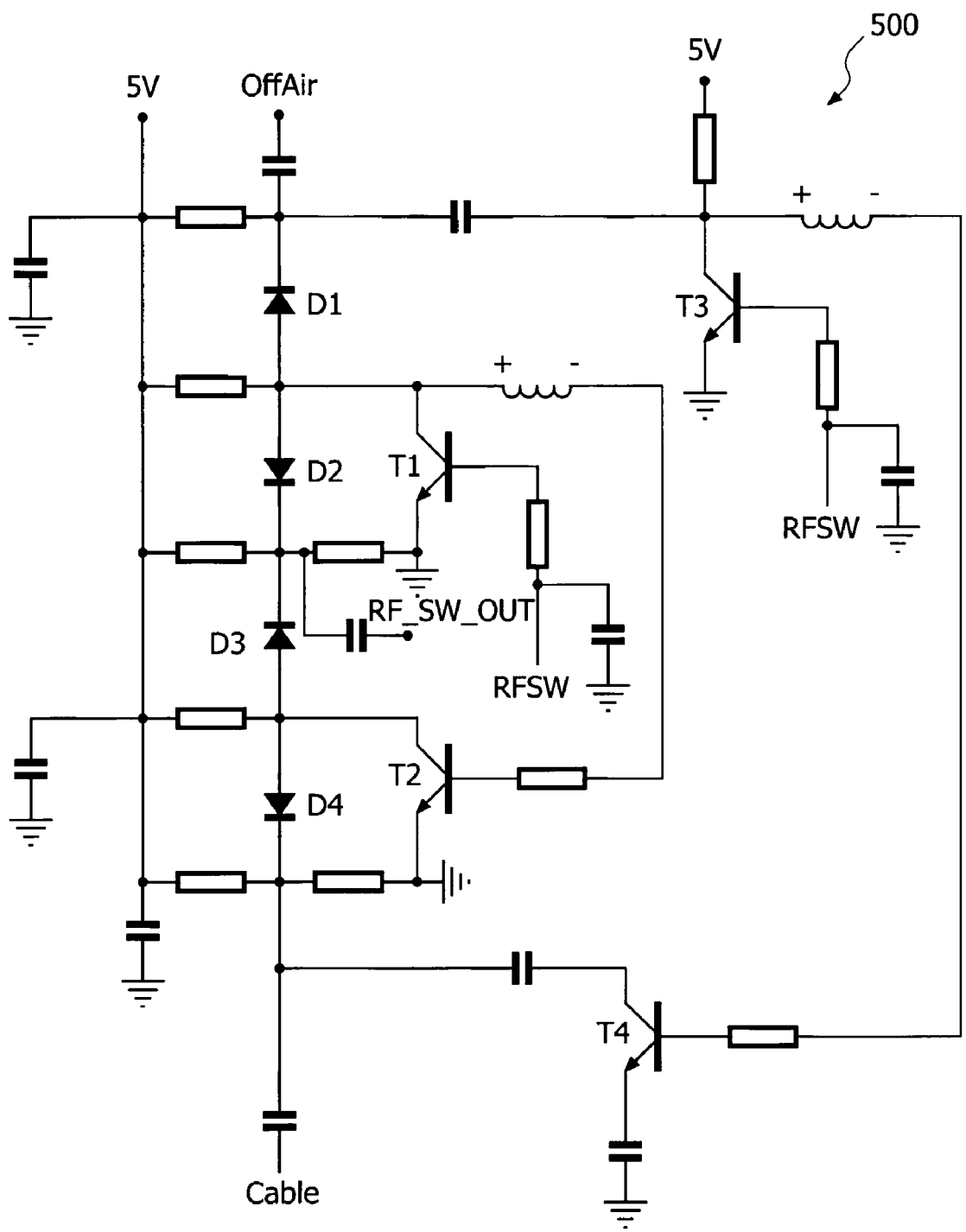
FIG. 5 shows a circuit diagram of an RF switch in accordance with the invention that comprises an extended number of diodes.
Figure 6:
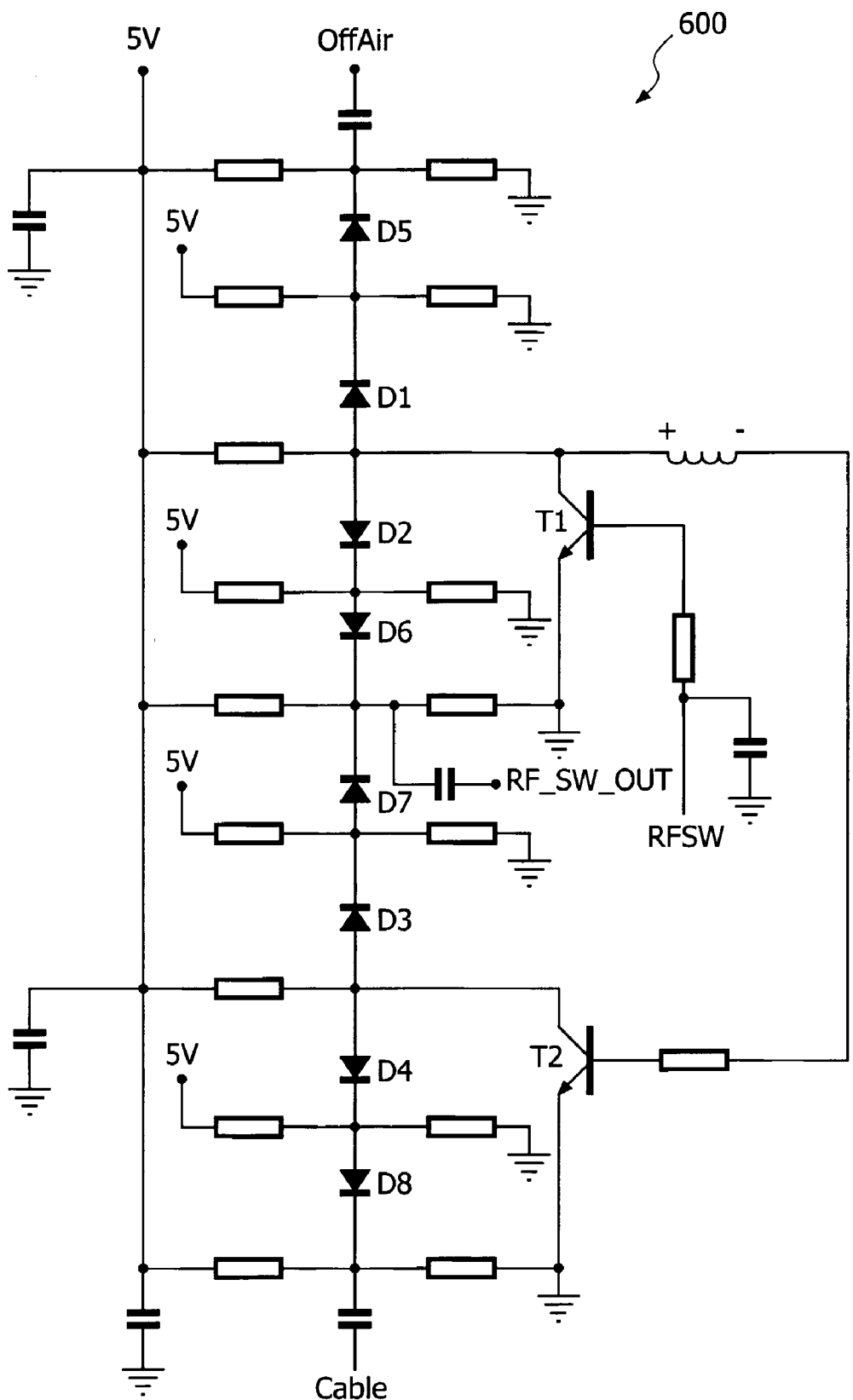
FIG. 6 shows a circuit diagram of an RF switch in accordance with the invention that comprises an extended the number of transistors.
Figure 7:
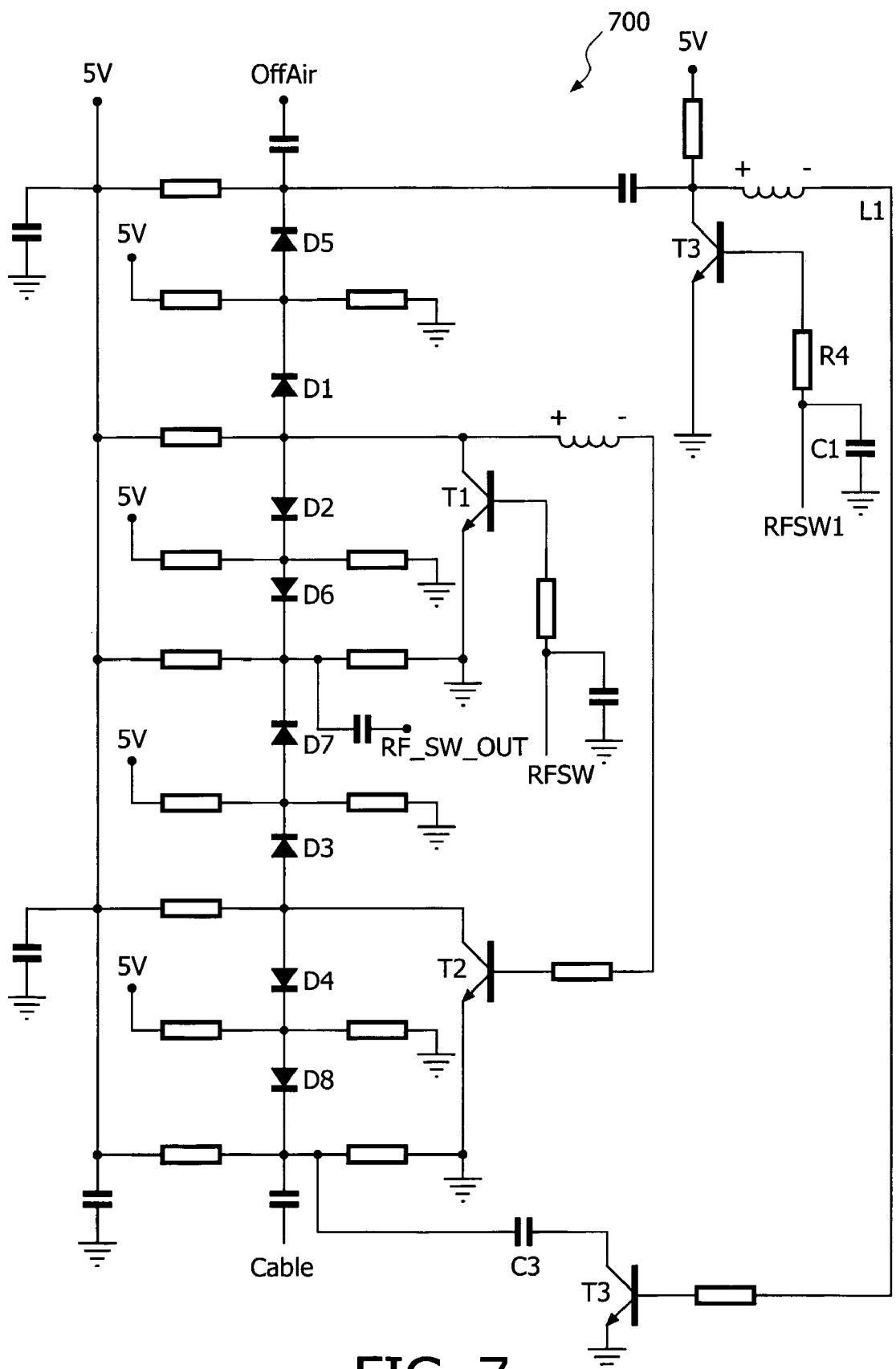
FIG. 7 shows a circuit diagram of an RF switch that comprises and extended number of transistors and diodes in accordance with the invention.

FIGS. 4*a* and 4*b* show examples of extended switches comprising a multiple of the RF switch circuit 200 of FIG. 2 (and/or RF switch circuit 500, 600 and 700 of FIGS. 5, 6 and 7 respectively or derivations thereof as a person skilled in the art could think of). FIG. 4*a* shows a three RF input to two RF-output switch. FIG. 4*b* shows a three RF input to one RF-output switch. One skilled in the art understands that other configurations can easily be configured as well.

FIG. 5 shows a circuit diagram of an RF switch that comprises an extended number of (preferably pin) diodes (D5, D6, D7 and D8) with periphery circuitry that will improve the input signal isolation performance.

FIG. 6 shows a circuit diagram of an RF switch that comprises an extended the number of transistors (T3 and T3) with periphery circuitry that also will improve the input signal isolation performance.

Finally, FIG. 7 shows a circuit diagram of an RF switch that comprises and extended number of transistors (T3 and T4) and (preferably pin) diodes (D5, D6, D7 and D8) that will even more improve the input signal isolation.

One of ordinary skill in the art will recognize that alternative schemes can be devised of designing the RF switch. For instance, instead of a (pin) diode a (pin) transistor may be used or another device that in performs in a similar way. Alternatively, it is also possible to use a power supply voltage other than 5V. The invention is also useful for other than RF switching, e.g., TV-IF-signal switching, audio- and/or video-base-band, other modulated signals (analogue, digital for audio, video and or digital signals).

The foregoing merely illustrates the principles of the invention. It will thus be appreciated that those skilled in the art will be able to devise various arrangements which, although not explicitly described or shown herein, embody the principles of the invention and are thus within its spirit and scope. Also one skilled in the art understands that certain components, such as coupling or decoupling capacitors can be added or deleted, depending on a design beyond the switching circuitry or certain design and performance criteria.

The invention claimed is:

1. An RF selection switch circuit, comprising:
   a first switch comprising:
      a first switch input port coupled to a first RF signal input port;
      a first switch output port coupled to an RF signal output port; and
      a first switch control port;
   a second switch comprising:
      a second switch input port coupled to a second RF signal input port;
      a second switch output port coupled to the RF signal output port; and
      a second switch control port;
   a control signal circuitry comprising:
      a first transistor having a basis DC coupled to an input control port, an emitter DC coupled to ground, and a collector DC coupled to the first diode switch control port and DC coupled to a supply voltage; and
      a second transistor having a basis DC coupled to the collector of the first transistor, an emitter DC coupled to ground, and a collector DC coupled to the second diode switch control port and DC coupled to a supply voltage,
   wherein the first switch output port, the second switch output port, and the RF signal output port are connected and are set at a DC level in between ground and supply voltage.

2. The RF selection switch circuit of claim 1, wherein the first switch comprises pin diodes and the second switch comprise pin diodes.

3. The RF selection switch circuit of claim 1, wherein the first transistor comprises a NPN transistor and the second transistor comprises a NPN transistor.

4. A tuning system comprising an RF selection switch circuit comprising:
   a first switch comprising:
      a first switch input port coupled to a first RF signal input port;
      a first switch output port coupled to an RF signal output port; and
      a first switch control port,
   a second switch comprising:
      a second switch input port coupled to a second RF signal input port;
      a second switch output port coupled to the RF signal output port; and
      a second switch control port,
   a control signal circuitry comprising:
      a first transistor, having a basis DC coupled to an input control port, an emitter DC coupled to ground and a collector coupled to the first diode switch control port and DC coupled to a supply voltage; and
      a second transistor having a basis DC coupled to the collector of the first transistor, an emitter DC coupled to ground, and a collector DC coupled to the second diode switch control port and DC coupled to a supply voltage,
   wherein the first switch output port, the second switch output port, and the RF signal output port are connected and are set at a DC level in between ground and supply voltage.

5. The tuning system of claim 4, wherein the first switch comprises pin diodes and the second switch comprise pin diodes.

6. The tuning system of claim 4, wherein the first transistor comprises a NPN transistor and the second transistor comprises a NPN transistor.

7. An apparatus for receiving RF signals from a multiple of sources comprising an RF selection switch circuit comprising:
   a first switch comprising:
      a first switch input port coupled to a first RF signal input port;
      a first switch output port coupled to an RF signal output port; and
      a first switch control port,
   a second switch comprising:
      a second switch input port coupled to a second RF signal input port;
      a second switch output port coupled to the RF signal output port; and
      a second switch control port,
   a control signal circuitry comprising,
      a first transistor having a basis DC coupled to an input control port, an emitter DC coupled to ground, and a collector DC coupled to the first diode switch control port and DC coupled to a supply voltage; and
      a second transistor having a basis DC coupled to the collector of the first transistor, an emitter DC coupled to ground, and a collector DC coupled to the second diode switch control port and DC coupled to a supply voltage,
   wherein the first switch output port, second switch output port, and the RF signal output port are connected and are set at a DC level in between ground and supply voltage.

8. The apparatus of claim 7, wherein the first switch comprises pin diodes and the second switch comprise pin diodes.

9. The apparatus of claim 7, wherein the first transistor comprises a NPN transistor and the second transistor comprises a NPN transistor.

10. An RF selection switch circuit, comprising:
    a control signal circuitry;
    a first diode switch coupled to a first RF signal input port, coupled to an RF signal output port, and coupled to the control signal circuitry;
    a second diode switch coupled to a second RF signal input port, coupled to the RF signal output port, and coupled to the control signal circuitry, wherein the control signal circuitry is arranged to select one of the first diode switch and the second diode switch for passing respective selected RF-input signal to the RF signal output port, and wherein the control signal circuitry is also arranged to establish a low-impedance mode on a non-selected of one of the first diode switch and the second diode switch as to minimize cross-talk from a non-selected RF-input signal to the RF signal output port;

wherein the first diode switch comprises two pin diodes connected with their anodes together, and wherein the second pin-diode switch comprises two pin diodes connected with their anode together; and wherein the first pin-diode switch further comprises a third diode in series with the anode of the third diode to one of the cathodes of the two pin diodes.

11. An three-to-two RF selection switch circuit, comprising:

RF input port 1, RF input port 2, and RF input port 3;
RF output port 1 and RF output port 2;
a first RF selection circuit of claim 10 having
    a first input connected to RF input port 1, a second input connected to RF input port 2, and a first output connected to RF output port 1; and a second RF selection switch circuit of claim 10 having
    a first input connected to RF input port 2, a second input connected to RF input port 3, and a first output connected to RF output port 2.

12. An three-to-one RF selection switch circuit, comprising

RF input port 1, RF input port 2, and RF input port 3;
RF output port;
a first RF selection switch circuit of claim 10 having
    a first input connected to RF input port 1, a second input connected to RF input port 2, and a first output connected to intermediate RF output port 1; and a second RF selection switch circuit of claim 10 having
    a first input connected to RF input port 2, a second input connected to RF input port 3, and a first output connected to intermediate RF output port 2; and a third RF selection switch circuit of claim 10 having
    a first input connected to intermediate RF output port 1, a second input connected to intermediate RF output port 2, and an output connected to the RF output port.

* * * * *

UNITED STATES PATENT AND TRADEMARK OFFICE
CERTIFICATE OF CORRECTION

| | | |
|---|---|---|
| PATENT NO. | : 7,696,840 B2 | Page 1 of 1 |
| APPLICATION NO. | : 11/574234 | |
| DATED | : April 13, 2010 | |
| INVENTOR(S) | : Kui Y. Lim et al. | |

It is certified that error appears in the above-identified patent and that said Letters Patent is hereby corrected as shown below:

In column 5, line 42, delete "first diode switch control" and insert --first switch control--.

In column 5, lines 46-47, delete "second diode switch control" and insert --second switch control--.

In column 6, line 10, delete "first diode switch control" and insert --first switch control--.

In column 6, lines 14-15, delete "second diode switch control" and insert --second switch control--.

In column 6, line 45, delete "first diode switch control" and insert --first switch control--.

In column 6, lines 49-50, delete "second diode switch control" and insert --second switch control--.

Signed and Sealed this
First Day of May, 2012

David J. Kappos
*Director of the United States Patent and Trademark Office*